(12) United States Patent
Peting et al.

(10) Patent No.: US 6,498,754 B2
(45) Date of Patent: Dec. 24, 2002

(54) MEMORY ARRAY ORGANIZATION FOR STATIC ARRAYS

(75) Inventors: Mark Peting, Tigard, OR (US); Thad McCracken, Portland, OR (US)

(73) Assignee: Digeo, Inc., Kirkland, WA (US)

( * ) Notice: Subject to any disclaimer, the term of this patent is extended or adjusted under 35 U.S.C. 154(b) by 0 days.

(21) Appl. No.: 09/784,828

(22) Filed: Feb. 15, 2001

(65) Prior Publication Data

US 2002/0136062 A1 Sep. 26, 2002

(51) Int. Cl.[7] ................................................. G11C 7/00
(52) U.S. Cl. ............................... 365/189.02; 365/189.05
(58) Field of Search ....................... 365/189.02, 189.05, 365/230.02, 233

(56) References Cited

U.S. PATENT DOCUMENTS

| | | | | | |
|---|---|---|---|---|---|
| 5,083,119 A | * | 1/1992 | Trevett et al. | ............... | 340/723 |
| 5,568,432 A | * | 10/1996 | Wada | .................... | 365/189.05 |
| 5,848,005 A | * | 12/1998 | Cliff et al. | ............. | 365/230.03 |
| 6,064,599 A | * | 5/2000 | Cliff et al. | ............. | 365/189.02 |
| 6,292,116 B1 | * | 9/2001 | Wang et al. | ................ | 341/100 |

* cited by examiner

Primary Examiner—Huan Hoang
(74) Attorney, Agent, or Firm—Blakely, Sokoloff, Taylor & Zafman

(57) ABSTRACT

The invention provides an efficient structure for synthesized static arrays. Array structures are very common in chip design, and often when doing ASIC design the option of custom-designing these arrays does not exist, therefore necessitating that the arrays be synthesized, placed and routed on silicon in a manner similar to random logic. Standard array structures are not easily synthesized, placed and routed. The invention takes advantage of the case in which the design requirements are such that the array is loaded in whole and then remains static for a period of time. The array implementation writes one column of the array (instead of a row) at a time so that the desired contents of the array are "rotated" 90 degrees before being written to the array. This allows the latches in a column to share a gated clock signal, which allows for an array placement optimized for clock distribution and for general routing density.

23 Claims, 5 Drawing Sheets

MEMORY ARRAY ORGANIZATION FOR STATIC ARRAYS

FIELD OF THE INVENTION

The invention relates to electronic systems. More particularly, the invention relates to a memory array organization for use in an electronic system.

BACKGROUND OF THE INVENTION

Typical memory array organizations are arranged as rows of latches because data is logically arranged in rows. For example, an instruction memory storing 8 eight-bit instruction words, would consist of eight rows of eight latches and associated decode and selection circuitry.

FIG. 1 illustrates an 8×8 memory organized as rows. Such a memory array organization is common in the prior art. However, when designing an application specific integrated circuit (ASIC), memory arrays, along with other circuit elements are synthesized, placed and routed using electronic design automation (EDA) tools. Because of the interconnection of latches and associated clocking signals, these memory arrays are not easily placed and routed.

Write addresses are decoded by address decode circuitry 100, which generates a write enable signal to cause the latches of a row of memory to latch the incoming data, labeled Write Data in FIG. 1. Data is read from the memory array by selecting the desired row from read multiplexer 120.

FIG. 2 illustrates an embodiment of a row of memory in the memory array of FIG. 1. FIG. 2 illustrates that each latch in each row of the memory array receives a gated clock signal to enable the latches. Given that the latches in any given row share a gated clock, it is necessary to place the latches in each row in very close proximity to each other, in order to control clock skew and limit the amount of place and route resources that must be dedicated to clock distribution within the array. Therefore, placement of the array of FIGS. 1 and 2 are placed to optimize clock routing lines, which increases the routing required to couple the latches to the read multiplexer.

SUMMARY OF THE INVENTION

A memory array having a plurality of latches is organized in columns and rows, the rows store contiguous bits of data. The memory array includes a first subset of latches and a second subset of latches. The first subset of latches represents a first column of data coupled to a first multiplexer to select signals from one of the first subset of latches. The first subset of latches is coupled to receive a first clock signal. The second subset of latches represents a second column of data coupled to a second multiplexer to select signals from the second subset of latches. The second subset of latches is coupled to receive a second clock signal.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Methods and apparatuses for layout of synthesized static arrays are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The invention provides an efficient structure for synthesized static arrays. Array structures are very common in chip design, and often when doing ASIC design the option of custom-designing these arrays does not exist, therefore necessitating that the arrays be synthesized, placed and routed on silicon in a manner similar to random logic. Standard array structures are not easily synthesized, placed and routed. The invention takes advantage of the case in which the design requirements are such that the array is loaded in whole and then remains static for a period of time. The array implementation writes one column of the array (instead of a row) at a time so that the desired contents of the array are "rotated" 90 degrees before being written to the array. This allows the latches in a column to share a gated clock signal, which allows for an array placement optimized for clock distribution and for general routing density.

Figure 3:
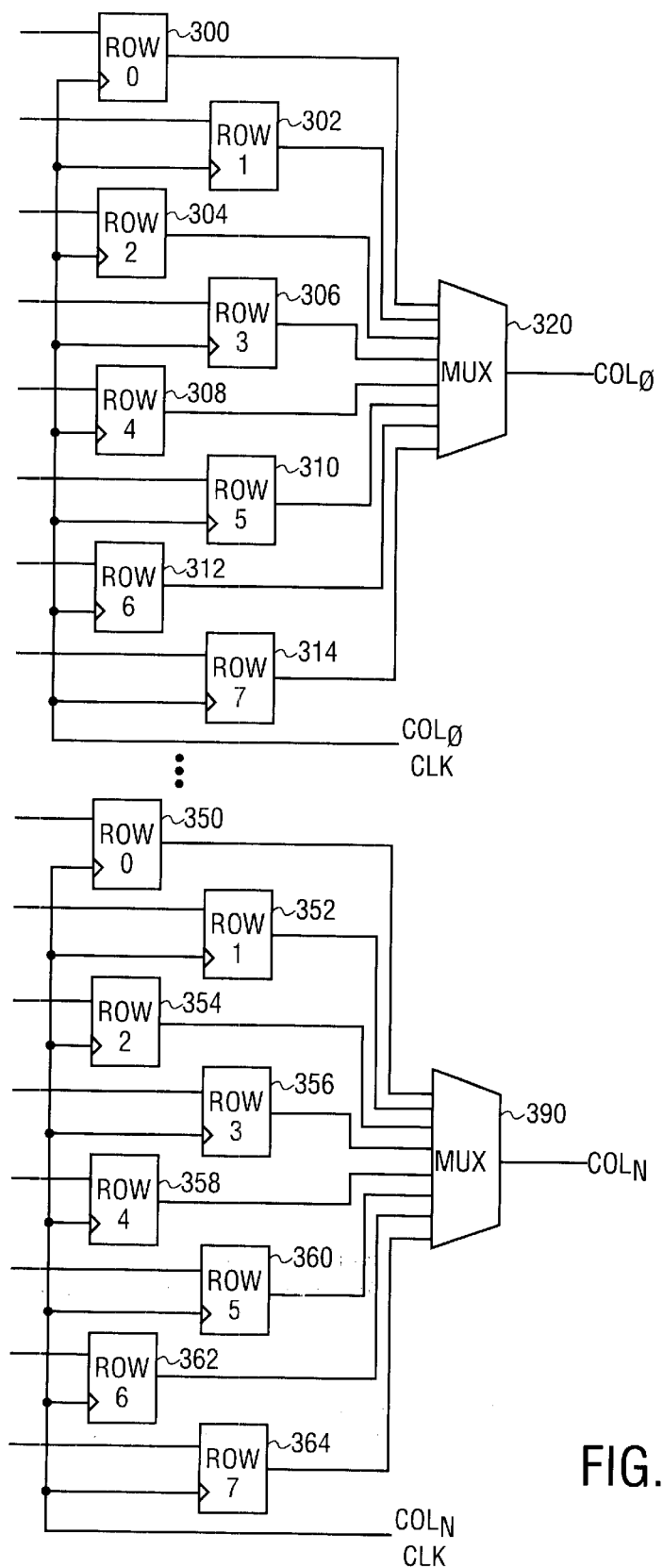
FIG. 3 illustrates one embodiment of a memory array organized as columns rather than rows.

FIG. 3 illustrates one embodiment of a memory array organized as columns rather than rows. FIG. 3 illustrates two columns of an eight row by N-column memory array. Each group of latches that represent a column of data receive a column clock signal (e.g., Col. O CLK, Col. N CLK). Because the latches for the respective columns are clustered together, the clock signals for the respective columns are distributed over short lines. Furthermore, the grouping of columns with multiplexers, which results in a distributed read multiplexer results in less complex routing between the latches and the multiplexers.

In one embodiment, each of the columns is placed and routed in a similar manner. The illustration of FIG. 3 logically represents the placement of latches and a multiplexer and routing of signals for a column of a memory array. The placement of the latches with respect to the column multiplexer simplifies the routing of the latch output signals to the multiplexer while not significantly increasing the routing complexity of the clock signals to the appropriate latches.

The columnar memory array is useful for use with memories that are written completely prior to being read and that the memories are not read while being written. Memories that are written and read in this manner include, for example, instruction memories, configuration memories and microcode memories. Other situations may also exist where columnar memories are useful.

Column 0 of the memory array includes latches 300, 302, 304, 306, 308, 310, 312 and 314 coupled to multiplexer 320. Similarly, column N of the memory array includes latches 350, 352, 354, 356, 358, 360, 362 and 364 coupled to multiplexer 390.

Figure 4:
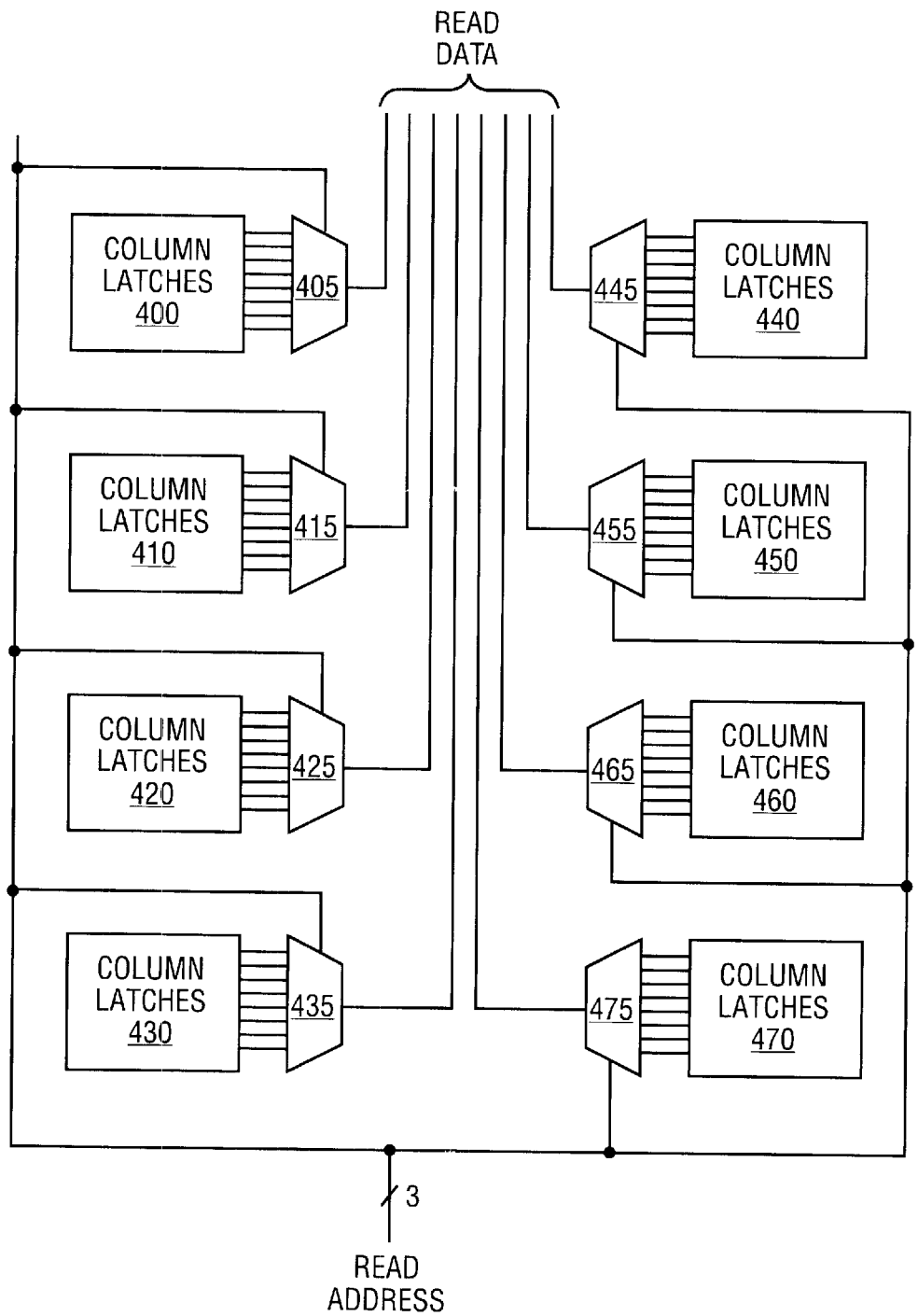
FIG. 4 illustrates one embodiment of a columnar memory array having the read multiplexers for the respective columns clustered.

FIG. 4 illustrates one embodiment of a columnar memory array having the read multiplexers for the respective columns clustered. Column latches 400, 410, 420, 430, 440, 450, 460 and 470 each represent, in one embodiment, a column of latches as described above with respect to FIG. 3. Multiplexers 405, 415, 425, 435, 445, 455, 465 and 475 are the read multiplexers that are coupled to the column latches.

Figure 1:
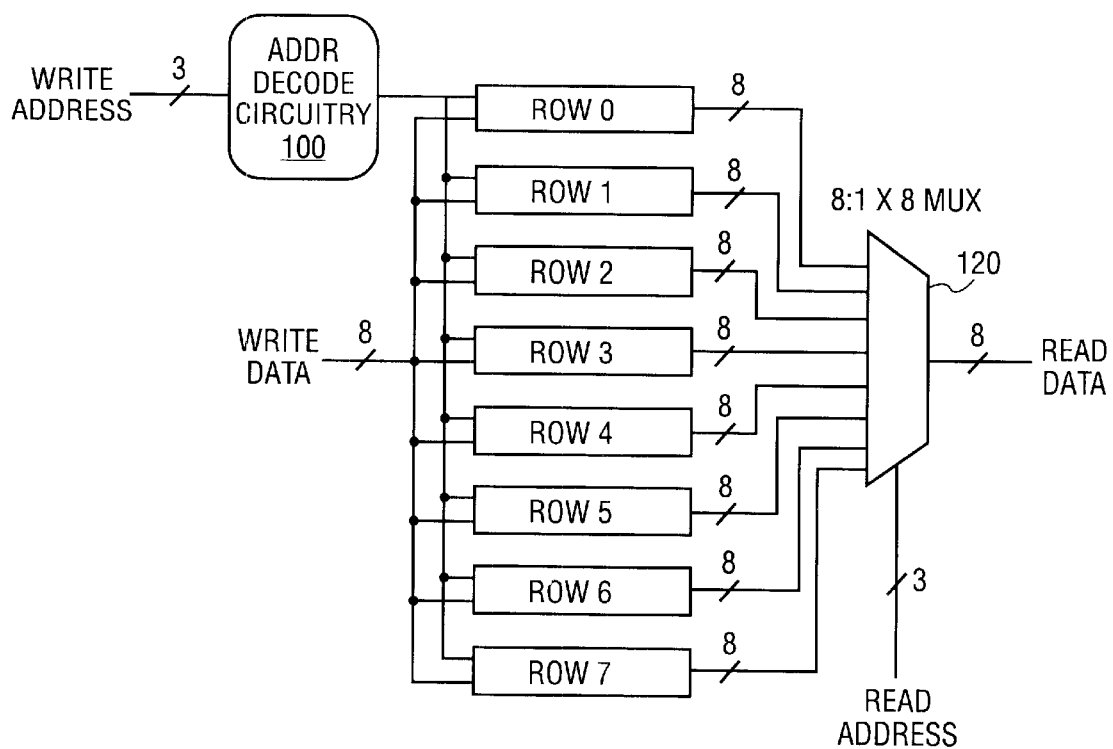
FIG. 1 illustrates an 8×8 memory organized as rows.

FIG. 4 illustrates the read multiplexers clustered together. The clustering of the read multiplexers allows multiple read multiplexers rather than the single read multiplexer of FIG. 1. The multiple distributed read multiplexers shortens the line routing between the latches and the read multiplexers without significantly increasing the routing complexity of the output of the read multiplexers.

Figure 2:
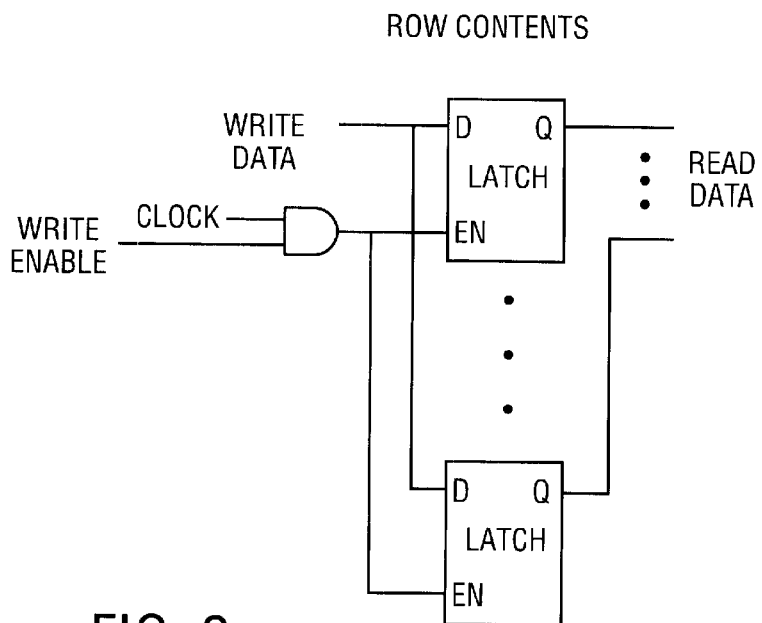
FIG. 2 illustrates an embodiment of a row of memory in the memory array of FIG. 1.

The memory array illustrated in FIGS. 3 and 4 results in most of the lines between components being of relatively short length with a minority of lines being of relatively long length. Because most EDA tools having place and route functionality place and route connections in regions of high connectivity (a large number of corrections) before regions of lower connectivity, the clustered columnar layout described with respect to FIGS. 3 and 4 results in simplified placement and routing as compared to traditional row-based arrays as described with respect to FIGS. 1 and 2.

Figure 5:
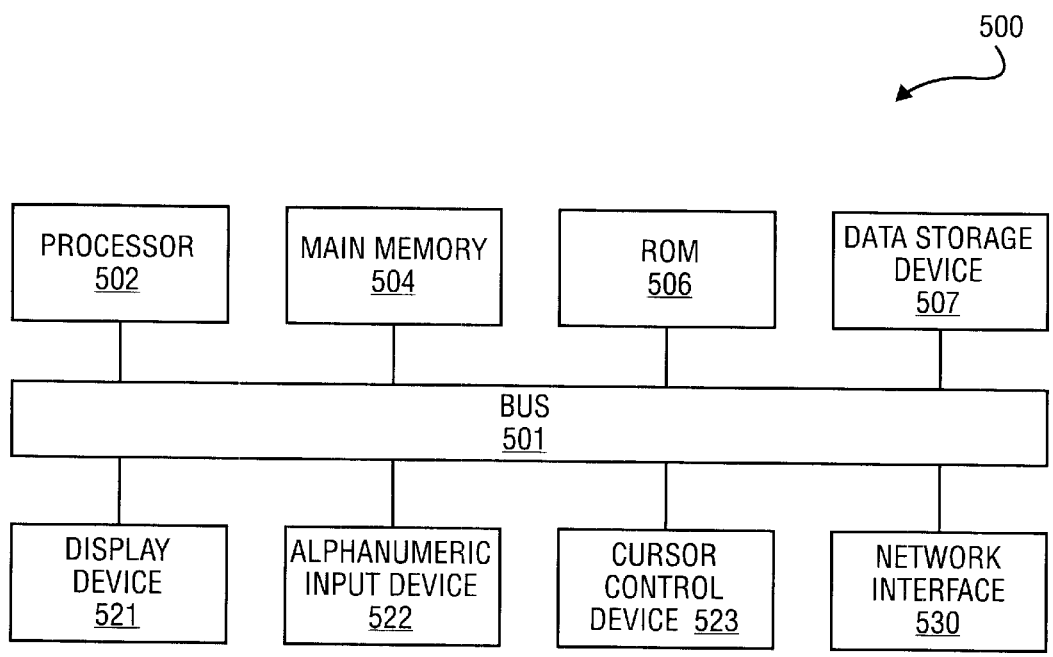
FIG. 5 is a block diagram of an electronic system in which a memory array organized as columns rather than rows can be used.

FIG. 5 is a block diagram of an electronic system in which a memory array organized as columns rather than rows can be used. The electronic system illustrated in FIG. 5 is intended to represent a range of electronic systems. Alternative electronic systems can include more, fewer and/or different components. The memory array could also be embedded in any component of an electronic system.

Electronic system 500 includes bus 501 or other communication device to communicate information, and processor 502 coupled to bus 501 to process information. While electronic system 500 is illustrated with a single processor, electronic system 500 can include multiple processors and/or co-processors. Electronic system 500 further includes random access memory (RAM) or other dynamic storage device 504 (referred to as main memory), coupled to bus 501 to store information and instructions to be executed by processor 502. Main memory 504 also can be used to store temporary variables or other intermediate information during execution of instructions by processor 502.

Electronic system 500 also includes read only memory (ROM) and/or other static storage device 506 coupled to bus 501 to store static information and instructions for processor 502. Data storage device 507 is coupled to bus 501 to store information and instructions. Data storage device 507 such as a magnetic disk or optical disc and corresponding drive can be coupled to electronic system 500.

Electronic system 500 can also be coupled via bus 501 to display device 521, such as a cathode ray tube (CRT) or liquid crystal display (LCD), to display information to a computer user. Alphanumeric input device 522, including alphanumeric and other keys, is typically coupled to bus 501 to communicate information and command selections to processor 502. Another type of user input device is cursor control 523, such as a mouse, a trackball, or cursor direction keys to communicate direction information and command selections to processor 502 and to control cursor movement on display 521.

Instructions are provided to memory from a storage device, such as magnetic disk, a read-only memory (ROM) integrated circuit, CD-ROM, DVD, via a remote connection (e.g., over a network via network interface 530) that is either wired or wireless, etc. In alternative embodiments, hard-wired circuitry can be used in place of or in combination with software instructions to implement the present invention. Thus, the present invention is not limited to any specific combination of hardware circuitry and software instructions.

A machine-readable medium includes any mechanism that provides (i.e., stores and/or transmits) information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Figure 6:
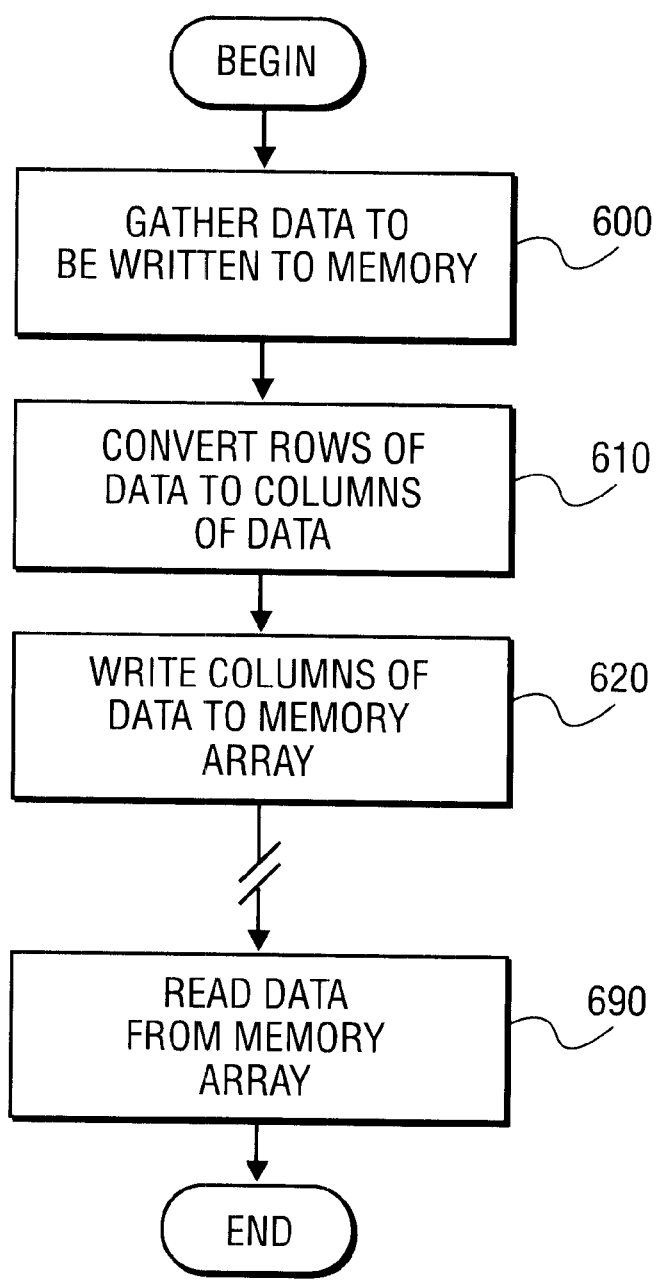
FIG. 6 is a flow diagram of one embodiment of writing data to a column based memory array.

FIG. 6 is a flow diagram of one embodiment of writing data to a column based memory array. The data to be written to memory is gathered at 600. Gathering of data can be accomplished in any manner known in the art. For example, the data can be received via a network connection and stored in a buffer, or the data can be read from a hard disk or other mass storage device.

Rows of data are converted to columns of data at 610. The following eight rows of eight bits are converted to eight columns of eight bits as illustrated. The conversion can be accomplished in any manner known in the art. The following rows of data:

| 1  | 2  | 3  | 4  | 5  | 6  | 7  | 8  |
|----|----|----|----|----|----|----|----|
| 9  | 10 | 11 | 12 | 13 | 14 | 15 | 16 |
| 17 | 18 | 19 | 20 | 21 | 22 | 23 | 24 |
| 25 | 26 | 27 | 28 | 29 | 30 | 31 | 32 |
| 33 | 34 | 35 | 36 | 37 | 38 | 39 | 40 |
| 41 | 42 | 43 | 44 | 45 | 46 | 47 | 48 |
| 49 | 50 | 51 | 52 | 53 | 54 | 55 | 56 |
| 57 | 58 | 59 | 60 | 61 | 62 | 63 | 64 | are converted to the following rows of data:

| 1 | 9  | 17 | 25 | 33 | 41 | 49 | 57 |
|---|----|----|----|----|----|----|----|
| 2 | 10 | 18 | 26 | 34 | 42 | 50 | 58 |
| 3 | 11 | 19 | 27 | 35 | 43 | 51 | 59 |
| 4 | 12 | 20 | 28 | 36 | 44 | 52 | 60 |
| 5 | 13 | 21 | 29 | 37 | 45 | 53 | 61 |
| 6 | 14 | 22 | 30 | 38 | 46 | 54 | 62 |
| 7 | 15 | 23 | 31 | 39 | 47 | 55 | 63 |
| 8 | 16 | 24 | 32 | 40 | 48 | 56 | 64 | the rows of the converted data contain the bits from the original columns of data. These written to the latches that store columns of data described in greater detailed above at 620.

After the data has been written to the memory array, the data can be read from the memory array at 690. Because of the columnar nature of the memory array, all data that is to the memory array are written prior to the data being read from the memory array.

In the foregoing specification, the invention has been described with reference to the specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A memory array having a plurality of latches organized in columns and rows, the rows storing contiguous bits of data, the memory array comprising:
   a first subset of latches representing a first column of data in the memory array coupled to only a first multiplexer to select signals from one of the first subset of latches, the first subset of latches coupled to receive a first clock signal; and
   a second subset of latches representing a second column of data in the memory array coupled to only a second multiplexer to select signals from the second subset of latches, the second subset of latches coupled to receive a second clock signal.

2. The memory array of claim 1 further comprising a control circuit to write data from the first column of one or more of the rows to the first subset of latches and to write data from the second column of one or more of the rows to the second subset of latches.

3. The memory array of claim 1 wherein data is written to each of the plurality of latches prior to the data being read from the plurality of latches, and further wherein data is not written to any of the plurality of latches while data is read from any of the plurality of latches.

4. The memory array of claim 1 wherein the plurality of latches are included in an integrated circuit, and further wherein the plurality of latches are designed, at least in part, using automatic place and route software.

5. The memory array of claim 1 further comprising:
   a third subset of latches representing a third column of data coupled to a third multiplexer to select signals from one of the third subset of latches, the third subset of latches coupled to receive a third clock signal; and
   a fourth subset of latches representing a fourth column of data coupled to a fourth multiplexer to select signals from the fourth subset of latches, the fourth subset of latches coupled to receive a fourth clock signal;
   wherein the plurality of latches and the first, second, third and fourth multiplexers are included in an integrated circuit, and further wherein the first, second, third and fourth multiplexers are clustered together.

6. The memory array of claim 1 wherein the plurality of latches stores one of: instruction data, microcode data and configuration data.

7. A method comprising:
   placing a first plurality of latches to store a first column of data in a memory array, the first plurality of latches coupled to only a first multiplexer to select signals from one of the first plurality of latches, the first plurality of latches coupled to receive a first clock signal; and
   placing a second plurality of latches to store a second column of data in the memory array, the second plurality of latches coupled to only a second multiplexer to select signals from one of the second plurality of latches, the second plurality of latches coupled to receive a second clock signal.

8. The method of claim 7 further comprising:
   writing data from a first column of one or more rows to the first plurality of latches; and
   writing data from a second column of one or more of the rows to the second plurality of latches.

9. The method of claim 7 wherein data is written to each of the plurality of latches prior to the data being read from the plurality of latches, and further wherein data is not written to any of the plurality of latches while data is read from any of the plurality of latches.

10. The method of claim 7 wherein the plurality of latches are included in an integrated circuit, and further wherein the plurality of latches are designed, at least in part, using automatic place and route software.

11. The method of claim 7 further comprising:
    placing a third plurality of latches to store a third column of data in a memory array, the third plurality of latches coupled to a third multiplexer to select signals from one of the third plurality of latches, the third plurality of latches coupled to receive a third clock signal; and
    placing a fourth plurality of latches to store a fourth column of data in the memory array, the fourth plurality of latches coupled to a fourth multiplexer to select signals from one of the fourth plurality of latches, the fourth plurality of latches coupled to receive a fourth clock signal;
    wherein the plurality of latches and the first, second, third and fourth multiplexers are included in an integrated circuit, and further wherein the first, second, third and fourth multiplexers are clustered together.

12. The method of claim 7 wherein the plurality of latches stores one of: instruction data, microcode data and configuration data.

13. A article comprising a machine-readable medium having stored thereon sequences of instructions that, when executed, cause one or more electronic systems to:
    place a first plurality of latches to store a first column of data in a memory array, the first plurality of latches coupled to a first multiplexer to select signals from one of the first plurality of latches, the first plurality of latches coupled to receive a first clock signal; and
    place a second plurality of latches to store a second column of data in the memory array, the second plurality of latches coupled to a second multiplexer to select signals from one of the second plurality of latches, the second plurality of latches coupled to receive a second clock signal, the first plurality of latches and the second plurality of latches coupled to different multiplexers.

14. The article of claim 13 further comprising sequences of instructions that, when executed, cause the one or more electronic systems to:
    write data from a first column of one or more rows to the first plurality of latches; and
    write data from a second column of one or more of the rows to the second plurality of latches.

15. The article of claim 13 wherein data is written to each of the plurality of latches prior to the data being read from the plurality of latches, and further wherein data is not written to any of the plurality of latches while data is read from any of the plurality of latches.

16. The article of claim 13 wherein the plurality of latches are included in an integrated circuit, and further wherein the plurality of latches are designed, at least in part, using automatic place and route software.

17. The article of claim 13 further comprising sequences of instructions that, when executed, cause the one or more electronic systems to:
    place a third plurality of latches to store a third column of data in a memory array, the third plurality of latches coupled to a third multiplexer to select signals from one of the third plurality of latches, the third plurality of latches coupled to receive a third clock signal; and place a fourth plurality of latches to store a fourth column of data in the memory array, the fourth plurality of latches coupled to a fourth multiplexer to select signals from one of the fourth plurality of latches, the fourth plurality of latches coupled to receive a fourth clock signal;

wherein the plurality of latches and the first, second, third and fourth multiplexers are included in an integrated circuit, and further wherein the first, second, third and fourth multiplexers are clustered together.

18. The article of claim 13 wherein the plurality of latches stores one of: instruction data, microcode data and configuration data.

19. A memory array having a plurality of latches organized in columns and rows, the rows storing contiguous bits of data, the memory array comprising:

a first subset of latches representing a first column of data coupled to a first multiplexer to select signals from one of the first subset of latches, the first subset of latches coupled to receive a first clock signal;

a second subset of latches representing a second column of data coupled to a second multiplexer to select signals from the second subset of latches, the second subset of latches coupled to receive a second clock signal; and a control circuit to write data from the first column of one or more of the rows to the first subset of latches and to write data from the second column of one or more of the rows to the second subset of latches.

20. The memory array of claim 19 wherein data is written to each of the plurality of latches prior to the data being read from the plurality of latches, and further wherein data is not written to any of the plurality of latches while data is read from any of the plurality of latches.

21. The memory array of claim 19 wherein the plurality of latches are included in an integrated circuit, and further wherein the plurality of latches are designed, at least in part, using automatic place and route software.

22. The memory array of claim 19 further comprising:

a third subset of latches representing a third column of data coupled to a third mutliplexer to select signals from one of the third subset of latches, the third subset of latches coupled to receive a third clock signal; and a fourth subset of latches representing a fourth column of data coupled to a fourth multiplexer to select signals from the fourth subset of latches, the fourth subset of latches coupled to receive a fourth clock signal;

wherein the plurality of latches and the first, second, third and fourth multiplexers are included in an integrated circuit, and further wherein the first, second, third and fourth multiplexers are clustered together.

23. The memory array of claim 19 wherein the plurality of latches stores one of: instruction data, microcode data and configuration data.

* * * * *